United States Patent [19]

Gruenwald et al.

[11] Patent Number: 5,009,738
[45] Date of Patent: Apr. 23, 1991

[54] APPARATUS FOR PLASMA ETCHING

[75] Inventors: Heinrich Gruenwald, Gomaringen; Hans Ramisch, Frankfurt; Anton Pawlakowitsch, Alzenau, all of Fed. Rep. of Germany

[73] Assignee: Leybold Aktiengesellschaft, Fed. Rep. of Germany

[21] Appl. No.: 444,293

[22] Filed: Dec. 1, 1989

[30] Foreign Application Priority Data

Apr. 28, 1989 [DE] Fed. Rep. of Germany ....... 3914065

[51] Int. Cl.$^5$ .............................................. C23F 1/02
[52] U.S. Cl. ................................... 156/345; 156/643; 204/298.31
[58] Field of Search .............................. 156/345, 643; 204/298.31, 298.15; 219/121.36, 121.4, 121.41, 121.43

[56] References Cited

U.S. PATENT DOCUMENTS

| | | |
|---|---|---|
| 4,209,357 | 6/1980 | Gorin et al. |
| 4,209,379 | 6/1980 | Freeman et al. |
| 4,261,762 | 4/1981 | King |
| 4,369,114 | 1/1983 | Steinberg et al. |
| 4,399,016 | 8/1983 | Tsukada et al. |
| 4,426,274 | 1/1984 | Ephrath |
| 4,514,636 | 4/1985 | King |
| 4,526,643 | 7/1985 | Okano et al. |
| 4,579,623 | 4/1986 | Suzuki et al. |
| 4,654,120 | 3/1987 | Dougherty |
| 4,771,730 | 9/1988 | Tezuka |

FOREIGN PATENT DOCUMENTS

| | | |
|---|---|---|
| 00257578-B1 | 4/1981 | European Pat. Off. |
| 0115970-B1 | 8/1984 | European Pat. Off. |
| 3633386-A1 | 4/1988 | Fed. Rep. of Germany |

*Primary Examiner*—Kenneth M. Schor
*Assistant Examiner*—John J. Bruckner
*Attorney, Agent, or Firm*—Hill, Van Santen, Steadman & Simpson

[57] ABSTRACT

An apparatus for the implementation of plasma etching processes providing a process chamber, an upper electrode, and a lower electrode. The upper electrode comprises an anode member, movable with respect to the process chamber, and provides a gas shower for delivering a highly reactive gas, such as a gas containing fluorine or chlorine, into the process chamber. The lower electrode provides a surface for holding a substrate to be etched, the lower electrode being supplied with a high-frequency negative voltage and cooled by an outside source. The process chamber is shaped to press the substrate to the lower electrode when the process chamber is lowered upon the substrate in preparation for operation. The process chamber presses the substrate around a continuous periphery of the substrate. The process chamber is provided with exhaust gas export holes which can be progressively aligned with matching holes in a perforated disk rotatably mounted to an outside surface of the process chamber. An accordion bellows seals the interface between the first electrode stem and process chamber, to prevent penetration of particles into the process chamber. The above-described apparatus is all preferably situated in a vacuum chamber.

25 Claims, 3 Drawing Sheets

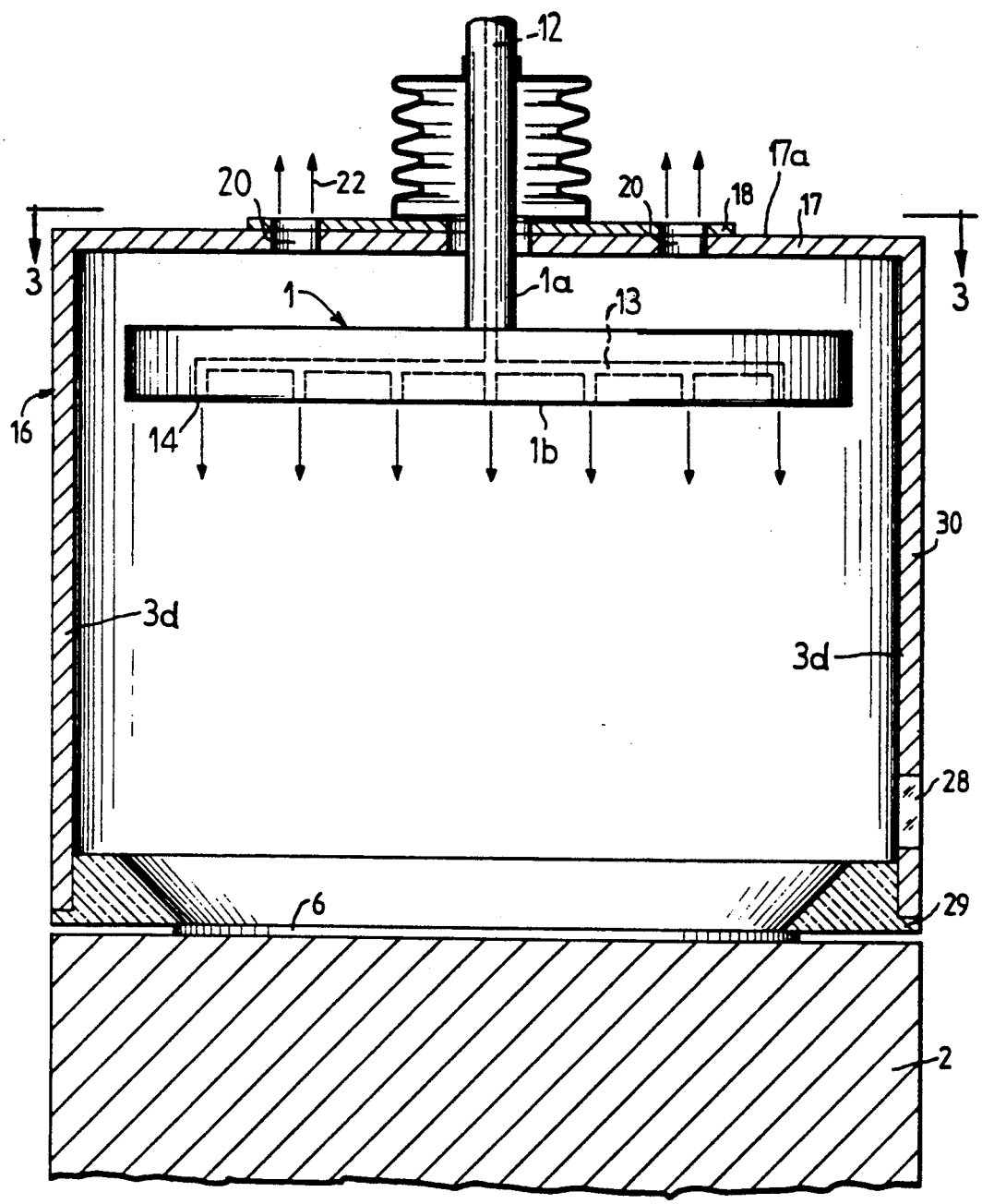

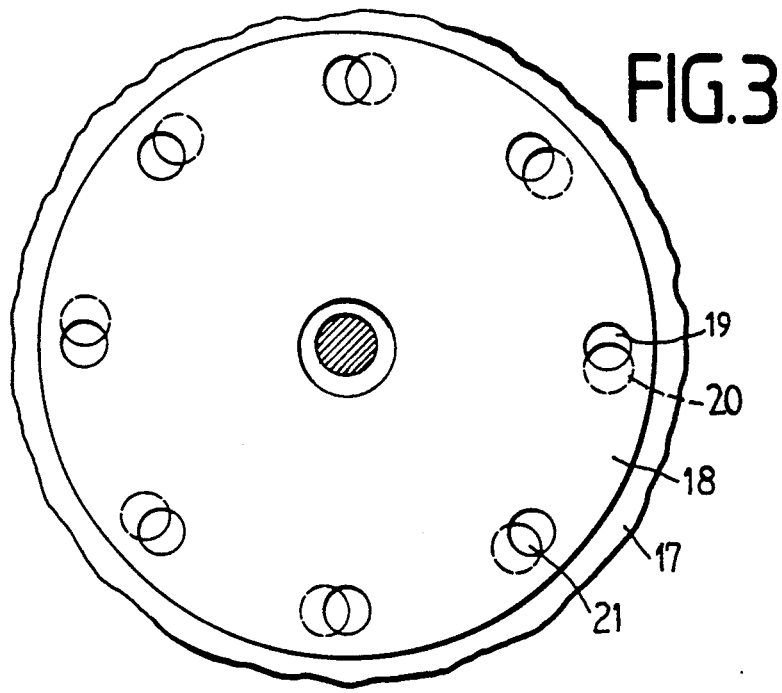
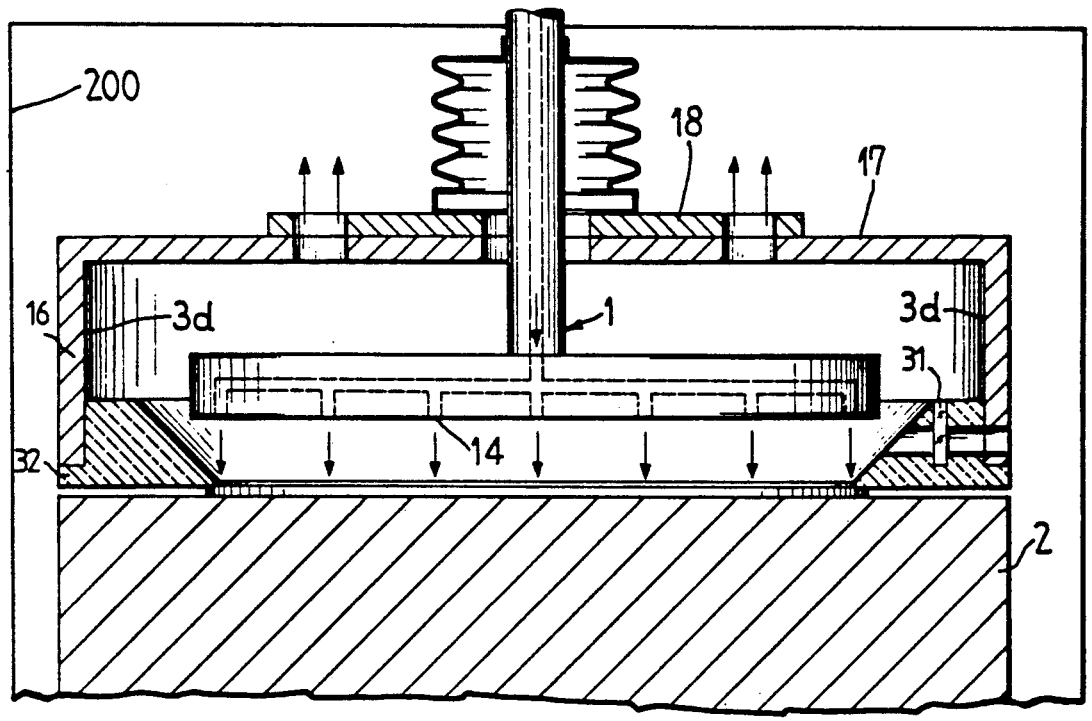

APPARATUS FOR PLASMA ETCHING

BACKGROUND OF THE INVENTION

The invention is directed to an apparatus for the implementation of plasma etching processes, particularly of reactive ion etching processes, comprising a reaction chamber, a first electrode and a second electrode.

Plasma-assisted processes are employed for working flat substrates, such as semiconductor wafers, in the manufacture of integrated electronic circuits. Such processes are referred to as "plasma etching", "reactive ion etching" or "plasma activated, chemical vapor phase deposition".

U.S. Pat. No. 4,209,379 already discloses a gas plasma reactor. According to claim 1 of this patent, the gas plasma reactor is provided with first and second electrodes that are fashioned such that they surround a reaction space that can be evacuated. The first electrode of the U.S. Patent has a series of openings for the admission of reaction gas into the reaction space and has a second series of openings for the discharge of the gaseous reaction products from the reaction space.

The following problems involving such apparatus are presently in the foreground of the art:

1. The substrates must be reproducibly and effectively tempered with optimum heat transmission. The substrates are thereby usually brought into contact with a heatable or coolable surface. The heat transmission is thereby limited by the actual contact surface that is usually too small or, respectively, by a gap between the heatable or coolable surface on the one hand and the substrates on the other hand.

2. As a result of mechanically moved parts within the process chamber, particles can arise that lead to blemishes or voids on the substrates. These blemishes or voids jeopardize the later functioning of parts fabricated from the substrates.

3. The plasma does not fill the entire volume of the process chamber but only a part thereof. The volume of plasma is greatly dependent on the process parameters. Experience has taught that even slight variations in the process parameters, such as pressure, suction power of the vacuum pump, electrical power or the delivery rates of the gases, noticeably modify the volume of the plasma and, thus, the energy density and the concentration of reactive particles over the substrates. The resulting effect is an inadequately concentrated plasma over the surface of the substrates to be processed, and, due to process chambers that are dimensioned with an excessively large volume, the plasma can also form at a farther distance from the substrates without reliably filling a defined volume, such as the process chamber.

The following solutions have been proposed or are being practiced in the current prior art for overcoming these problems:

1. For improving the heat transmission between a tempering surface and the back side of the substrate, it has been proposed to fill the gap between the two contact surfaces with a material, such as vacuum grease, or with oils having a low vapor pressure, as employed in rotary vane pumps. However, the plasma can be disadvantageously contaminated with the material. As an alternative, the employment of gases as heat-transmitting medium between the two contact surfaces has been disclosed in U.S. Pat. No. 4,514,636; U.S. Pat. No. 4,261,762; and U.S. Pat. No. 4,579,623. However, a precise monitoring of the admission of the heat-transmitting gas is necessary, as is a separate fixing of the substrate. Separate fixing can be particularly disadvantageous for the treatment of lightweight substrates, such as silicon wafers.

Another way of improving the heat transmission between the two contact surfaces is by pressing the substrates against the tempering surface. For example, this can be accomplished by electrostatic attraction of the substrate against the tempering surface, as disclosed in U.S. Pat. No. 4,399,016. According to this patent, this method requires excellent dielectric layers on the tempering surface, which is difficult in practice. It is, therefore, more common to execute the pressing of the substrate with mechanical means, such as claws or pins, or rings actuated with spring pressure, as disclosed in U.S. Pat. No. 4,367,114. These mechanical means, however, frequently effect local inhomogeneities of the plasma that lead to a non-uniform processing of the substrate. Furthermore, pressing means actuated by spring pressure tend to create a pressing power that is inadequately reproducible.

2. Due to abrasion, the known mechanical means for pressing a substrate against a tempering surface produces particles that can proceed onto the substrate. In one type of system, in order to keep particles away from the surface of the substrate to be treated, the substrate is oriented having its surface to be processed facing down. The substrate is pressed against the upper electrode of what is referred to as a parallel plate reactor. This structure, however, makes the loading of the process chamber considerably more mechanically involved.

3. For concentrating the plasma close to a substrate to be processed, U.S. Pat. No. 4,209,357 discloses a small process chamber that allows a reliable definition of the plasma volume. Means for pressing the substrate against a tempering support, however, are not provided.

It is, therefore, new to the art to provide an apparatus for the implementation of plasma etching processes that: provides a reliable and reproducible temperature control of flat substrates to be processed by mechanically pressing these substrates against a tempering surface; prevents particles produced by abrasion of the pressing mechanism from proceeding onto the surface of the substrate; concentrates the plasma in a defined volume close to the substrate to be processed without local inhomogeneities of the plasma occurring; provides means to adjust exhaust gas flow; provides for easy adaptation to adjust anode effective area; and provides for easy adaptation of the reactive gas delivery and distribution system to comply with select operating conditions.

SUMMARY OF THE INVENTION

It is the object of the present invention to provide an apparatus which: provides an enhanced concentration of plasma for reaction, provides a reliable and effective method for pressing the substrate against the lower electrode or cathode, provides a reduced ratio of the area of the anode to the area of the cathode.

Also included in the object is to achieve a greater flexibility in the setting of the process parameters. In particular, a fast, reliable and economical adaptation of the process parameters to user wishes, i.e. to specific process rules, is an object of this invention.

Thus, it is an object of the present invention that the ratio of the sizes of the anode area which includes the area of the inside reactor wall that participate in the process, on the one hand, and the cathode surface, on the other hand, be capable of being modified in a simple way in order, based on the theory of the Langmuir probe, to modify the voltage potentials between plasma and cathode dependent on the process rule.

It is an object of the present invention that the apparatus should achieve an improved heat elimination for the substrate during the etching process.

It is a further object of the present invention that the directedness of the etching be improved. The gas should be conducted out of the upper electrode onto the substrate lying therebelow in an optimally defined fashion.

The stated objects are inventively achieved in that the upper electrode, preferably grounded, is arranged inside the process chamber movable in the direction toward the lower electrode, preferably the cathode, and is provided with at least one process gas exit aperture, preferably, however, with a plurality of process gas delivery apertures; and that the lower electrode is fashioned as a substrate carrier, is high-frequency voltage fed, and comprises a negative potential in comparison to the plasma.

The required process chamber volume is reduced to minimum dimensions in that the upper electrode, the process chamber and the lower electrode form a reaction chamber in which the plasma is concentrated. The process gas is delivered into this reaction chamber via the delivery apertures.

A reliable pressing of the substrate against the lower electrode is achieved in that a process chamber is arranged suspended over the upper electrode and the process chamber sits on the peripheral edge of the substrate when the process chamber is lowered and, due to its dead weight, presses the substrate against the lower electrode. The invention avoids the pressing with a three-finger claw that is a common method in the art. A non-uniform plasma is usually formed at the position of the claw. This in turn causes a non-uniform etching. Also, by pressing around a periphery of the substrate, no pressing means resides above the substrate which could generate unwanted particles.

Inside walls of the reaction chamber are grounded and contribute to effective anode area. The ratio of anode to cathode areas can be effectively reduced by utilizing smaller process chambers with corresponding smaller inside wall areas which contribute less to the total anode area. The smaller process chambers are possible, in part, because the substrate is pressed peripherally, and no overhead clearance between the substrate and the upper electrode is required for a mechanical pressing means. The upper electrode is movable, with respect to the process chamber, toward the lower electrode once the process chamber presses the substrate. Thus by the first electrode approaching the substrate, the plasma concentrated in the reaction chamber, the ratio between the total anode area relative to the cathode area is reduced because the area of the inside walls of the reaction chamber is reduced.

Modified user wishes lead to modified process rules. In order to satisfy this, the process parameters must be modified. Included thereamong as an important process parameter is the difference between the potential of the plasma on the one hand, and of the substrate electrode on the other hand. This difference between the potentials is a function of the difference between the areas of the two electrodes participating in the process. The area of the inside wall of the reaction chamber that is grounded must be added to the area of the upper electrode, also grounded, to determine overall anode area.

When this overall anode area is then altered in that the inside wall of the process chamber is modified by replacing the process chamber or, alternatively, by utilizing a different configuration of the inside wall of the process chamber, then the desired modification of the difference between the potentials of the plasma and of the substrate electrode is obtained in an extremely simple and economical fashion.

It is, therefore, proposed in a further development of the invention that the process chamber is interchangeably provided and can be replaced by a different process chamber having a different effective area of the inside wall dependent on the required process rules.

It is also proposed that the size of the effective area of the inside wall of the process chamber is adjustable. This can be accomplished by moving the upper electrode with respect to the inside wall of the process chamber, changing the size of the reaction chamber.

It has proven expedient that the process chamber is provided with at least one exhaust opening in its upper wall, particularly for the gaseous reaction products from the process chamber.

It can thereby be provided that the exhaust openings comprise adjustable flow cross sections that, in particular, are formed of holes of a perforated disk that is rotatable relative to the upper wall of the process chamber and of corresponding holes in the wall of the process chamber that can be variably aligned to the holes of the disk. Thus, the exhaust gas can be throttled according to selected process rules.

The execution of the method can also be advantageously influenced in that the upper electrode is provided with exit apertures for process gas that are fashioned and arranged such that the gas flows produced can be utilized as process parameters adjustable according to the required process rule, particularly in terms of their direction and intensity.

For monitoring the process, it is proposed that the process chamber is provided with an observation window, particularly in a side wall. It can thereby be provided that the window is composed of silicon oxide or of sapphire.

The lower edge of the process chamber can be provided with a ceramic pressing plate in which a sapphire window is preferably arranged.

The upper electrode is expediently fashioned like a circular disk. In order to guarantee the directedness of the gas streams, it is further proposed that the upper electrode is fashioned as a gas shower, preferably having alignment onto the substrate situated on the second electrode.

A cost-saving design is comprised therein that the gas shower comprises a perforated sheet, whereby the holes in the perforated sheet represent the gas exit apertures.

The following advantages are achieved with the invention:

1. A greater concentration of the plasma is achieved, the required process chamber volume is reduced, the pressing of the substrate against the lower electrode is improved, the heat elimination during the process for the substrate is improved, the ratio between the area of the anode/reactor wall relative to the cathode is reduced; and 2. Greater flexibility in setting the process parameters is achieved.

Further details of the invention may be derived from the following description of a plurality of exemplary embodiments of the invention.

BRIEF DESCRIPTION OF THE DRAWINGS

FIG. 2 is a schematic sectional illustration of a further exemplary embodiment of the subject matter of the invention;

FIG. 3 is a section generally along line III—III of FIG. 2, showing a perforated disk; and FIG. 4 is a schematic sectional view through a further exemplary embodiment of the subject matter of the invention.

DESCRIPTION OF THE PREFERRED EMBODIMENTS

Figure 1:
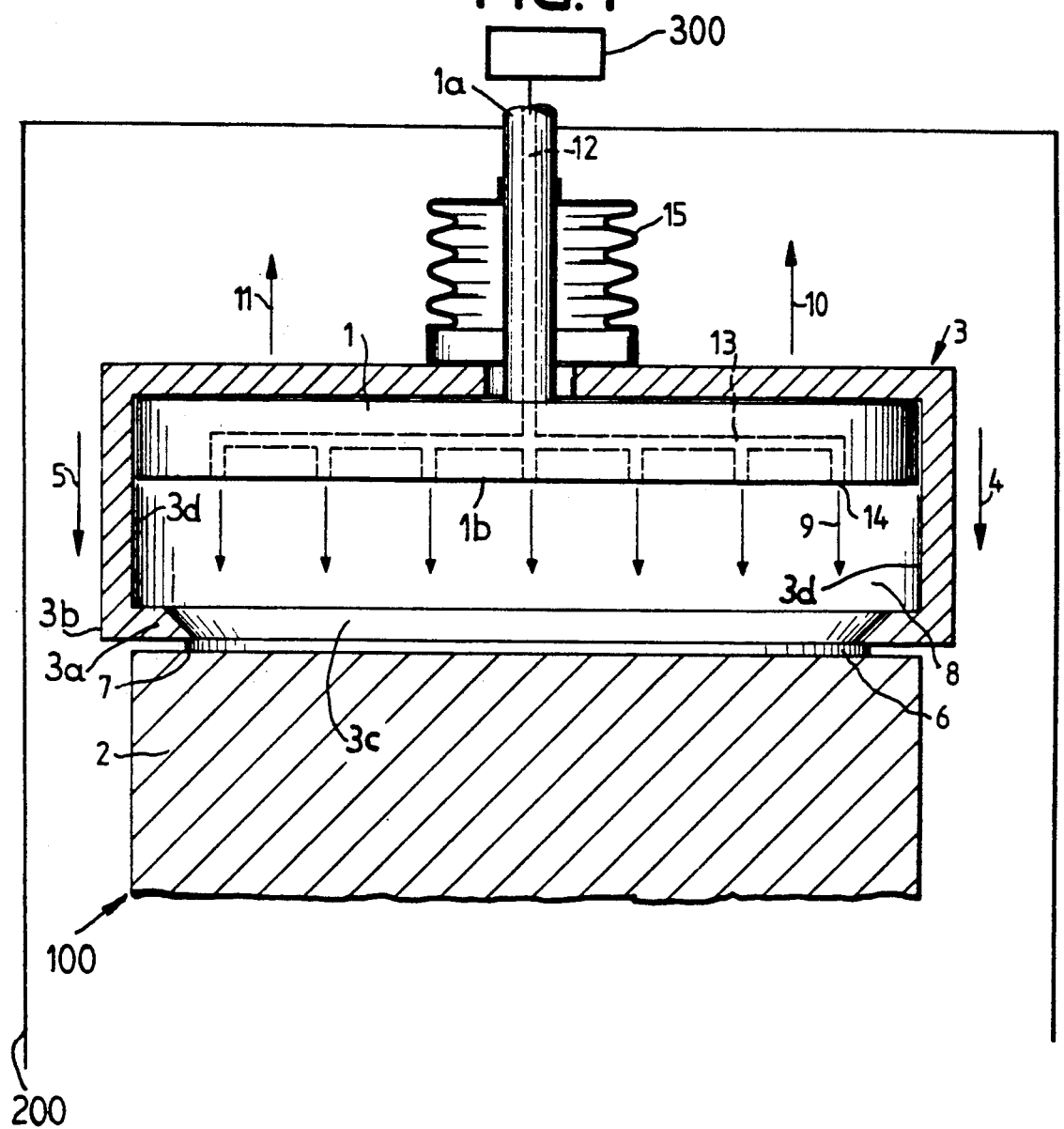
FIG. 1 is a schematic illustration of a section through a reaction chamber for a plasma etching process.

FIG. 1 shows an etching apparatus generally at 100 interior of a vacuum recipient 200 shown schematically. The apparatus 100 comprises an upper electrode 1 and a lower electrode or substrate electrode 2. The upper electrode 1 comprises a stem 1a and a head 1b. A process chamber 3 is arranged suspended over and around the upper electrode. When the upper electrode is lowered in the direction of the arrows 4, 5 the process chamber is also lowered. A plate portion 3a formed at a bottom 3b of the process chamber 3 is seated on the edge of a substrate 6. The substrate 6 may be a silicon wafer or another type of surface to be etched. An edge region of the substrate is referenced 7. The plate portion 3a provides a central opening 3c wherethrough an etching surface 6a of the substrate 6 faces the upper electrode 1. Due to its dead weight, the plate portion 3a presses the substrate 6 onto the lower electrode 2. Operating on a simple dead weight principle, the pressing force of the recipient 3a is reproducibly precise compared to a spring loaded system.

When the apparatus is placed in operation, process gas, such as highly reactive gas containing fluorine or chlorine, from outside source 300, enters into the reaction chamber 8 via the upper electrode 1. Distribution of the process gas is symbolized by a plurality of arrows in FIG. 1. One of these arrows bears reference number 9. a plasma is formed that is concentrated in the reaction chamber 8 formed by the upper electrode 1, the process chamber 3 and the lower electrode 2 covered by the substrate 6. The exhaust gases arising during the reaction are extracted in an upward direction, as shown in FIGS. 2 and 4.

After the etching of the substrate 6 has been completed, the upper electrode 1 is moved in an upward direction. The process chamber 3 is thereby likewise moved in an upward direction, as indicated by arrows 10, 11. The substrate 6 can be removed and can be replaced by a new substrate to be etched by entering the new substrate into the vacuum recipient 200 through an openable sluice value (not shown).

The lower electrode or substrate electrode 2 is high-frequency voltage supplied. The substrate electrode 2 possesses a negative potential in comparison to the plasma. The substrate electrode 2 is cooled. An effective cooling of the substrate 6 is achieved by the surface contact of the substrate 6 to the lower electrode 2, particularly by the pressing of the substrate with the dead weight of the process chamber 3, as described above. By pressing the substrate 6 around a periphery, an effective contact surface between the substrate 6 and the lower electrode 2 is increased over the known use of claws or pins for pressing.

The upper electrode 1 is fashioned as a gas shower. It comprises a channel system for the process gas. A main channel 12 interior of the stem 1a feeds branch channels 13 interior of the head 1b, which delivers process gas directly toward the substrate 6 through a plurality of exit apertures, one thereof being referenced 14. Any number of apertures 14 and any size arrangement and orientation of the apertures is possible to accommodate process rules, especially with respect to direction and intensity. A bellows 15 serves the purpose of sealing the reaction chamber. The bellows 15 allows for movement of the stem 1a with respect to the process chamber 3, in a direction along an axis of the stem 1a.

Whereas the substrate electrode 2 comprises a negative potential in comparison to the plasma, the upper electrode 1 as well as the process chamber 3 are grounded.

Since the surface of the upper electrode 1 and the inside wall 3d of the reaction chamber 8 electrically act as one anode surface that reside opposite a smaller surface (cathode surface) of the substrate electrode 2, the substrate 6 is bombarded with ions from the plasma. The substrate 6 is eroded or etched by the bombardment.

Included among the advantages of the invention are that the process chamber 3 is interchangeable. An alternatively utilized process chamber having a different area of the inside walls 3d leads to different ratios of anode to cathode effective areas and therefore different relationships of the potentials. It is, thus, possible to satisfy different wishes on the part of the user, i.e. different process rules. The process chambers 16 shown in FIG. 2 and FIG. 4 illustrate two possible relative sizes for inside walls 3d, which would provide differing ratios of anode to cathode areas.

Whereas FIG. 1 shows the upper electrode 1 in a remote position from the substrate 6, FIGS. 2 and 4 show the upper electrode 1 moved with respect to the process chamber 16, toward the substrate 6. Thus, selective movement of the upper electrode 1 toward the substrate 6 reduces the size of the reaction chamber 8 and thus reduces the effective area of the walls 3d, and thus reduces the anode to cathode area ratio. It can be provided in another exemplary embodiment (not shown) that the size of the effective area of the inside wall 3d of the existing process chamber could be fashioned adjustable.

In apparatus known to the art, the substrate is pressed against the substrate electrode by a three-finger claw. A non-uniform plasma is formed in the region of the claw in the prior art. A non-uniform etching occurs as a result thereof. This disadvantage is avoided by the described placing of the process chamber 3 onto the edge of the substrate 6. Also, particles generated by moving mechanical parts located above the substrate 6 are prevented by pressing the substrate 6 around its periphery.

An alternate process chamber 16 may be seen in FIG. 2. The upper process chamber wall 17 carries a perforated disk or cover 18 on an outside surface 17a. The shape of the perforated disk 18 is shown in FIG. 3. Eight holes 19 are distributed around an inner concentric circle of the disk 18. Corresponding to these holes 19 in the perforated disk, matching holes 20 are provided in the upper wall 17 of the process chamber.

The perforated disk 18 is rotatable relative to the upper wall 17 of the process chamber 16. As may be particularly seen from FIG. 3, flow cross sections for the exhaust, comprising selective congruent portions of each hole 19 and matching hole 20, can be modified by turning the perforated disk relative to the upper process chamber wall 17. The out-flowing exhaust gas is identified in FIG. 2 with four arrows, one of these arrows being referenced 22. It is thereby possible to influence important process parameters, such as, for example, the dwell time of the process gas and of the reaction products.

FIG. 2 shows an observation window 28 composed of silicon dioxide installed into a lateral wall 30 of the process chamber 16.

A press plate 29 mounts to the process chamber 16 and faces the substrate 6. The press plate 29 is pressed against the substrate 6 when the process chamber 16 is lowered. The press plate 29 is composed of ceramic material and provides electrical insulation between the process chamber 16 and the substrate electrode 2.

Except for relative size of the process chamber 16, FIG. 4 is similar to FIG. 2. However, whereas the window 28 in FIG. 2 is composed of silicon dioxide and is applied in the lateral wall 30 of the process chamber 16, the window 31 of FIG. 4 is composed of sapphire and it is arranged through a second ceramic press plate 32.

The window serves the purpose of optical recognition of the completion of etching. The completion of the etching has occurred when an outer layer of the substrate 6 to be removed has been removed and no further material is to be eroded.

As shown in FIGS. 2 and 4, the upper electrode 1 is fashioned as a gas shower; it is provided with a perforated disk 18. The process gas, for example gas containing fluorine or chlorine, discharges from the apertures 14. It reacts with the material of the substrate; silicon fluoride and aluminum chloride are eliminated into the vapor phase. These gaseous reaction products, by contrast to the art, are not downwardly extracted but upwardly extracted via the matching holes 20.

A complete process cycle is as follows. A lifting mechanism lifts the upper electrode 1 and the process chamber 3, 16. A means, such as a robot arm (not shown) introduces the substrate 6 into the vacuum recipient 200 through a sluice (not shown) that is opened. The substrate 6 is deposited on the lower electrode 2 with a suitable mechanism. After the robot arm has left the vacuum recipient 200 and its sluice door has been closed, the upper electrode 1 is lowered. The process chamber 3, 16 simultaneously moves in a downward direction and is seated on the edge of the substrate 6. Due to the dead weight of the process chamber 3, the substrate 6 is pressed against the lower electrode 2. The upper electrode 1 can be further lowered toward the substrate 6. The lower electrode 2 is cooled. A skilled fashioning and arrangement of the components enables a concentration of the plasma between the upper electrode 1, the lower electrode 2 and the process chamber 3, 16, as well as an effective pressing of the substrate 6 against the lower electrode. The plasma has a positive potential in comparison to the high-frequency voltage supplied substrate electrode 2. After completion of etching, the substrate 6 is removed in a reverse operation to installation. The upper electrode and the process chamber 3, 16 is lifted and the robot arm unloads the process chamber 3, 16. The entire operation is repeated for a new process.

Although various modifications may be suggested by those versed in the art, it should be understood that we wish to embody within the scope of the patent granted hereon all such modifications as reasonably and properly come within the scope of our contribution to the art.

We claim:

1. An apparatus for plasma etching of a substrate comprising:

a process chamber wherein said substrate is etched, said process chamber having a gas conducting connection for receiving a process gas therein from an outside source, said process chamber comprising an enclosure having a bottom plate with a central etching window therethrough;

a first electrode, facing the interior of said chamber for facing a first face of said substrate;

a second electrode facing the interior of said chamber for facing a second face of said substrate, said second electrode maintained at an electric potential different from said first electrode, said second electrode in heat transfer with an external source, said second electrode positioned so as to support said substrate against said bottom plate, and provide a central etching area of said substrate exposed to an interior of said chamber through said central etching window of said bottom plate; and the weight of said process chamber being such so as to press said bottom place down upon a continuous periphery of said substrate, and press said substrate against said second electrode.

2. An apparatus as claimed in claim 1, wherein said first electrode comprises an anode and said second electrode comprises a cathode, said anode at a ground electrical potential, said cathode at a negative electrical potential, fed by a high-frequency outside source.

3. An apparatus as claimed in claim 1, wherein said first electrode and said process chamber are at an equivalent electrical potential, and said first electrode resides interior of said process chamber.

4. An apparatus as claimed in claim 3 wherein said process chamber is movable from a loading position remote from said second electrode to an operating position pressing down on said substrate on top of said second electrode, and said first electrode is movable with said process chamber from the loading position to the operating position said first electrode is movable with respect to said process chamber, toward said substrate irrespective of the position of the chamber.

5. An apparatus as claimed in claim 3, wherein said bottom plate is composed of a ceramic material.

6. An apparatus as claimed in claim 5, wherein said bottom plate further comprises an observation window.

7. An apparatus as claimed in claim 6, wherein said observation window is composed of sapphire.

8. An apparatus as claimed in claim 3, wherein said first electrode is part of the connection with the outside source of process gas for delivery of process gas into said process chamber, said process chamber is movable from a loading position remote from said second electrode to an operating position pressing down on said substrate periphery on top of said second electrode, and said first electrode is movable with said process chamber from the loading position to the operating position, and once said process chamber is lowered to the operating position, said first electrode is movable with respect to said process chamber, toward said substrate.

9. An apparatus as claimed in claim 8, wherein said first electrode comprises:

a stem movably projecting into said process chamber;

a head connected to said stem inside said process chamber, said stem having a main channel interior of said stem, said main channel communicating process gas to a plurality of branch channels interior of said head, said branch channels terminating in a plurality of apertures communicating outwardly of said head.

10. An apparatus as claimed in claim 9, wherein said apparatus further comprises a bellows surrounding a portion of said stem, sealed against said process chamber and against said stem, said bellows maintaining a sealed integrity of said process chamber.

11. An apparatus as claimed in claim 9, wherein said process chamber comprises a wall with at least one opening for removal of exhaust gases, and said opening is located above said head.

12. An apparatus as claimed in claim 1, wherein said process chamber comprises a wall with at least one opening for removal of exhaust gases.

13. An apparatus as claimed in claim 12, wherein said process chamber comprises a cover rotatable with respect to said wall about an axis normal to said wall, said cover mounted closely adjacent to said wall, said cover having at least one hole progressively alignable with the opening in said wall such that, the rotation of said cover with respect to said wall selectively throttles out flow of exhaust gases.

14. An apparatus as claimed in claim 1, wherein said first electrode comprises a disk shaped electrode.

15. An apparatus as claimed in claim 14, wherein said disk shaped electrode is part of said connection and comprises a perforated plate having apertures which are directed toward said second electrode, for deliverying process gas to the substrate.

16. An apparatus as claimed in claim 1, wherein said process chamber further comprises an observation window.

17. An apparatus as claimed in claim 16, wherein said observation window is composed of silicon oxide.

18. An apparatus as claimed in claim 16, wherein said observation window is composed of sapphire.

19. An apparatus for plasma etching of a substrate comprising:
a process chamber having a top wall, an enclosing side wall, and a perimeter pressing surface connected to said side wall, said pressing surface being opposite said top wall, said perimeter pressing surface circumscribing a central open area open to an inside of said process chamber;
a first electrode residing inside said chamber and facing said central open area, said first electrode being selectively movable within said chamber, toward and away from said central open area, said first electrode being at an equivalent electrical potential as said process chamber, said first electrode being constructed so as to selectively communicate process gas into said process chamber;
a second electrode being positioned so as to support a substrate against said perimeter pressing surface and said substrate faces said perimeter pressing surface and said central open area so that said substrate will have a central etching area exposed to the interior of said chamber through said central open area, said second electrode being at a negative electrical potential fed by a high-frequency voltage source, said second electrode being positioned so as to be in heat transfer relationship with said substrate, said second electrode being positioned so as to be in heat transfer with an external heating source or heat sink; and
said perimeter pressing surface being such so as to press the weight of said process chamber down upon a continuous periphery of said substrate during operation of said apparatus, and press said substrate into contact with said second electrode.

20. An apparatus as claimed in claim 19, wherein said first electrode comprises:
a movable stem projecting into said process chamber, said stem positioned so as to lower and raise said electrode and said process chamber toward and away from said substrate;
a head connected to said stem inside said process chamber, said stem having a main channel interior of said stem for communicating processing gas into said chamber, said main channel communicating with a plurality of branch channels interior of said head, said branch channels terminating in a plurality of apertures communicating outwardly of said head.

21. An apparatus as claimed in claim 20, wherein said process chamber further comprises on said top wall at least one opening for out flow of exhaust gases, and a cover rotatable with respect to said top wall about an axis normal to said top wall, said cover mounted closely adjacent to said top wall, said cover having at least one hole progressively alignable with the opening is said top wall, by rotation of said cover with respect to said top wall for selectively throttling out flow of exhaust gases.

22. An apparatus as claimed in claim 20 wherein said stem penetrates said process chamber through said top wall and said head and stem are positioned and arranged so as to be movable within said process chamber toward and away from said substrate when said process chamber is pressing down on said substrate, and when said stem is fully retracted upward, said head presses against said top wall.

23. An apparatus for plasma etching of a substrate comprising:
a process chamber wherein said substrate is etched, said process chamber having a gas conducting connection for receiving process gas therein from an outside source, said process chamber comprising an enclosure having a bottom with a central opening therein;
a first electrode having a stem projecting into said process chamber; and a head, connected to said stem and residing inside said process chamber, said stem having a main channel interior of said stem, said main channel communicating with a plurality of branch channels interior of said head, said branch channels terminating in a plurality of apertures for communicating outwardly of said head, said main channel receiving process gas from an outside source and distributing process gas into said process chamber through said branch channels and out of said apertures, said apertures arranged on a side of said head which faces said substrate to be etched, said first electrode maintained at an equivalent electric potential as said process chamber, and said head being movable with respect to said process chamber toward said central opening;
a second electrode providing a mounting surface for holding said substrate to be etched, said second electrode being arranged so as to position said substrate to be etched to cover said central opening along a continuous periphery of said substrate and have a first face of said substrate face the interior of said process chamber through said central opening, and said second electrode being maintained at an electric potential different from said first electrode.

24. An apparatus as claimed in claim 23 wherein said head is positioned and arranged so as to be movable toward said central opening in a downward direction, and said process chamber comprises a wall with at least one exhaust opening for out-flow of exhaust gases, said exhaust opening located at a position for upward removal of the exhaust gases with respect to said substrate.

25. An apparatus as claimed in claim 24 wherein said process chamber comprises a cover rotatable with respect to said wall about an axis normal to said wall, said cover mounted closely adjacent to said wall, said cover having at least one hole progressibly alignable with said exhaust opening through said wall so that rotation of said cover with respect to said wall selectively throttles out-flow of the exhaust gases.

* * * * *